(12) United States Patent
Venkatraman et al.

(10) Patent No.: US 8,606,732 B2
(45) Date of Patent: Dec. 10, 2013

(54) METHODS AND SYSTEMS FOR REWARD-MODULATED SPIKE-TIMING-DEPENDENT-PLASTICITY

(75) Inventors: Subramaniam Venkatraman, San Diego, CA (US); Venkat Rangan, San Diego, CA (US); Jeffrey A. Levin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 454 days.

(21) Appl. No.: 12/850,493

(22) Filed: Aug. 4, 2010

(65) Prior Publication Data

US 2012/0036099 A1 Feb. 9, 2012

(51) Int. Cl.
*G06E 1/00* (2006.01)
*G06E 3/00* (2006.01)
*G06F 15/18* (2006.01)
*G06G 7/00* (2006.01)
*G06N 3/04* (2006.01)

(52) U.S. Cl.
USPC ........................................................ 706/27

(58) Field of Classification Search
USPC ........................................ 706/27, 26, 15, 62
See application file for complete search history.

(56) References Cited

U.S. PATENT DOCUMENTS

2008/0162391 A1  7/2008  Izhikevich
2010/0220523 A1*  9/2010  Modha et al. ................. 365/167

FOREIGN PATENT DOCUMENTS

WO  WO9414134 A1  6/1994

OTHER PUBLICATIONS

Razvan V. Florian, "Reinforcement learning through modulation of spike-timing-dependent synaptic plasticity", Center for Cognitive and Neural Studies (Coneural), Str. Saturn nr. 24, 400504 Cluj-Napoca, Romania, Edited version appeared in Neural Computation 19 (6), pp. 1468-1502, 2007.*
Singh et al, "Reinforcement Learning with Replacing Eligibility Traces", Machine Learning, 22,123-158, (1996), 1996 Kluwer Academic Publishers, Boston, Manufactured in The Netherlands.*
Shayani et al, "An FPGA-based Model suitable for Evolution and Development of Spiking Neural Networks", ESANN'2008 proceedings, European Symposium on Artificial Neural Networks—Advances in Computational Intelligence and Learning Bruges (Belgium), Apr. 23-25, 2008.*
Shayani et al, "Hardware Implementation of a Bio-plausible Neuron Model for Evolution and Growth of Spiking Neural Networks on FPGA", Conference on Adaptive Hardware and Systems, 200B. AHS 'OB. NASA/ESA, Date of Conference: Jun. 22-25, 2008, Conference Publications, pp. 236-243.*
Baras et al, "Reinforcement Learning, Spike Time Dependent Plasticity and the BCM Rule", Department of Electrical Engineering Technion, HAIFA 32000, Israel, Sep. 8, 2006.*
Rast et al, "The Deferred Event Model for Hardware-Oriented Spiking Neural Networks", ICONIP (2), Year: 2008, pp. 1057-1064.*
Schemmel et al, "A New VLSI Model of Neural Microcircuits Including Spike Time Dependent Plasticity", Proceedings. 2004 IEEE International Joint Conference on Neural Networks, 2004, pp. 1711-1716 vol. 3, Date of Conference: Jul. 25-29, 2004.*
"GenericDAModulatedSTDPSynapse.h", Generated on Wed Jul. 9 16:34:39 2008 for PCSIM by "doxygen" 1.5.5.*

(Continued)

*Primary Examiner* — Jeffrey A Gaffin
*Assistant Examiner* — Ilya Traktovenko
(74) *Attorney, Agent, or Firm* — Rupit M. Patel

(57) ABSTRACT

Certain embodiments of the present disclosure support techniques for simplified hardware implementation of the reward-modulated spike-timing-dependent plasticity (STDP) learning rule in networks of spiking neurons.

27 Claims, 9 Drawing Sheets

(56) References Cited

OTHER PUBLICATIONS

Pecevski, "Spike-Timing-Dependent Plasticity and its Reward-Modulated Variant", Institute for Theoretical Computer Science Graz University of Technology, Neural Networks B, Apr. 2009.*

M. Izhikevich, "Solving the distal reward problem through linkage of STDP and dopamine signaling", Cerebral Cortex, Oct. 2007.

A.R. Houweling, M. Brecht, "Behavioral report of single neuron stimulation in somatosensory cortex", Nature 451, pp. 65-68, Jan. 2008.

M. Hosomi, H. Yamagishi, T. Yamamoto, K. Bessho, Y. Higo, K. Yamane, H. Yamada, M. Shoji, H. Hachino, C. Fukumoto, H. Nagao, H. Kano, "A novel nonvolatile memory with spin torque transfer magnetization switching: spin-ram", IEEE International Electron Devices Meeting, pp. 459-462, 2005.

Robert Legenstein, Dejan Pecevski, Wolfgang Maas, "A learning Theory of reward modulated spike timing dependent plasticity with application to biofeedback", PLoS Computational Biology, 2008.

N.A. Otmakhova, J.E. Lisman, "D1/D5 dopamine receptor activation increases the magnitude of early long-term potentiation at CA1 hippocampal synapses", Journal of Neuroscience, vol. 16, pp. 7478-7486.

Arthur V. et al., "Learning in Silicon: Timing is Everything", Advances in Neural Information Processing Systems 18, May 1, 2006, XP55010017, ISBN: 978-0-26-223253-1 Retrieved from the Internet: URL:http://www.Stanford.edu/group/brainsinsilicon/pdf/05_conf_NIPS_SiLearning.pdf [retrieved on Oct. 19, 2011].

International Search Report and Written Opinion—PCT/US2011/046472—ISA/EPO—Oct. 28, 2011.

Legenstein R. et al., "A Learning Theory for Reward-Modulated Spike-Timing-Dependent Plasticity with Application to Biofeedback", PLOS Computational Biology, vol. 4, No. 10, Jan. 1, 2008, p. E1000180, XP55010014, ISSN: 1553-734X, DOI:10.1371/journal.pcbi.1000180 p. 1-p. 27.

Schemmel J. et al., "Implementing Synaptic Plasticity in a VLSI Spiking Neural Network Model", International Joint Conference on Neural Networks, 2006. IJCNN '06, Piscataway, NJ: IEEE Operations Center, Piscataway, NJ, USA, Jan. 1, 2006, pp. 1-6, XP002557202, ISBN: 978-0-7803-9490-2 Retrieved from the Internet: URL:http://www.kip.uni-heidelberg.de/Veroeffentiichungen/download.cgi/4620/ps/1774.pdf [retrieved on Nov. 23, 2009].

Otmakhova N.A., et al., "D1/D5 dopamine receptor activation increases the magnitude of early long-term potentiation at CA1 niopocampal synapses". The Journal of Neuroscience. Dec. 1, 1996, vol. 16, No. 23 pp. 7478-7486.

* cited by examiner

METHODS AND SYSTEMS FOR REWARD-MODULATED SPIKE-TIMING-DEPENDENT-PLASTICITY

FIELD

Certain embodiments of the present disclosure generally relate to neural system engineering and, more particularly, to a method for hardware implementation of reward-modulated spike-timing-dependent plasticity (STDP).

BACKGROUND

Reward-modulated spike-timing-dependent plasticity (STDP) is considered as a strong candidate for a learning rule to explain behaviorally relevant weight changes in networks of spiking neurons. This scheme requires an exponentially decaying eligibility trace with a time constant of a plurality of seconds for every synapse. Since neural networks of interest often have millions of synapses, implementing such an exponentially decaying eligibility trace for every synapse can be very expensive in terms of silicon area.

A direct implementation of the eligibility trace in hardware can place analog or digital circuits in each synapse to create an exponential time constant. Such a solution may require hundreds of square microns per synapse. Therefore, an area-efficient implementation of the reward-modulated STDP might be needed.

SUMMARY

Certain embodiments of the present disclosure provide a neural electrical circuit. The electrical circuit generally includes a plurality of neuron circuits and synapses, wherein each of the synapses connects one pair of the neuron circuits, and a first memory storing weights of the synapses, a second memory storing the same weights and a third memory comprising one element for each of the synapses, wherein a weight of synapse connecting a pair of the neuron circuits is updated in the second memory and an element of the third memory associated with that synapse is switched from a first to a second logical state, if that pair of neuron circuits spike, all elements of the third memory which were in the second logical state switch at a defined frequency to the first logical state with a probability, when a reward occurs, the updated weight of synapse is copied from the second memory to the first memory, if the element is in the second logical state, and the weight of synapse is copied from the first memory to the second memory overwriting the updated weight, if the element is in the first logical state.

Certain embodiments of the present disclosure provide a method for implementing a neural system with a plurality of neuron circuits and synapses, wherein each of the synapses connects one pair of the neuron circuits. The method generally includes storing weights of the synapses in a first memory and in a second memory of the neural system, wherein a third memory of the neural system comprises one element for each of the synapses, updating, in the second memory, a weight of synapse connecting a pair of the neuron circuits and switching an element of the third memory associated with that synapse from a first to a second logical state, if that pair of neuron circuits spike, switching, at a defined frequency, all elements of the third memory which were in the second logical state to the first logical state with a probability, copying, when a reward occurs, the updated weight of synapse from the second memory to the first memory, if the element is in the second logical state, and copying the weight of synapse from the first memory to the second memory overwriting the updated weight, if the element is in the first logical state.

Certain embodiments of the present disclosure provide an apparatus for implementing a neural system with a plurality of neuron circuits and synapses, wherein each of the synapses connects one pair of the neuron circuits. The apparatus generally includes means for storing weights of the synapses in a first memory and in a second memory of the neural system, wherein a third memory of the neural system comprises one element for each of the synapses, means for updating, in the second memory, a weight of synapse connecting a pair of the neuron circuits and switching an element of the third memory associated with that synapse from a first to a second logical state, if that pair of neuron circuits spike, means for switching, at a defined frequency, all elements of the third memory which were in the second logical state to the first logical state with a probability, means for copying, when a reward occurs, the updated weight of synapse from the second memory to the first memory, if the element is in the second logical state, and means for copying the weight of synapse from the first memory to the second memory overwriting the updated weight, if the element is in the first logical state.

Certain embodiments of the present disclosure provide a computer program storage apparatus for implementing a neural system with a plurality of neuron circuits and synapses, wherein each of the synapses connects one pair of the neuron circuits, comprising a computer-readable memory having software instructions stored thereon, the software instructions being executable by one or more processors. The software instructions generally include instructions for storing weights of the synapses in a first memory and in a second memory of the neural system, wherein a third memory of the neural system comprises one element for each of the synapses, instructions for updating, in the second memory, a weight of synapse connecting a pair of the neuron circuits and switching an element of the third memory associated with that synapse from a first to a second logical state, if that pair of neuron circuits spike, instructions for switching, at a defined frequency, all elements of the third memory which were in the second logical state to the first logical state with a probability, instructions for copying, when a reward occurs, the updated weight of synapse from the second memory to the first memory, if the element is in the second logical state, and instructions for copying the weight of synapse from the first memory to the second memory overwriting the updated weight, if the element is in the first logical state.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only certain typical embodiments of this disclosure and are therefore not to be considered limiting of its scope, for the description may admit to other equally effective embodiments.

DETAILED DESCRIPTION

Various embodiments of the disclosure are described more fully hereinafter with reference to the accompanying drawings. This disclosure may, however, be embodied in many different forms and should not be construed as limited to any specific structure or function presented throughout this disclosure. Rather, these embodiments are provided so that this disclosure will be thorough and complete, and will fully convey the scope of the disclosure to those skilled in the art. Based on the teachings herein one skilled in the art should appreciate that the scope of the disclosure is intended to cover any embodiment of the disclosure disclosed herein, whether implemented independently of or combined with any other embodiment of the disclosure. For example, an apparatus may be implemented or a method may be practiced using any number of the embodiments set forth herein. In addition, the scope of the disclosure is intended to cover such an apparatus or method which is practiced using other structure, functionality, or structure and functionality in addition to or other than the various embodiments of the disclosure set forth herein. It should be understood that any embodiment of the disclosure disclosed herein may be embodied by one or more elements of a claim.

The word "exemplary" is used herein to mean "serving as an example, instance, or illustration." Any embodiment described herein as "exemplary" is not necessarily to be construed as preferred or advantageous over other embodiments.

Although particular embodiments are described herein, many variations and permutations of these embodiments fall within the scope of the disclosure. Although some benefits and advantages of the preferred embodiments are mentioned, the scope of the disclosure is not intended to be limited to particular benefits, uses or objectives. Rather, embodiments of the disclosure are intended to be broadly applicable to different technologies, system configurations, networks and protocols, some of which are illustrated by way of example in the figures and in the following description of the preferred embodiments. The detailed description and drawings are merely illustrative of the disclosure rather than limiting, the scope of the disclosure being defined by the appended claims and equivalents thereof.

Exemplary Neural System

Figure 1:
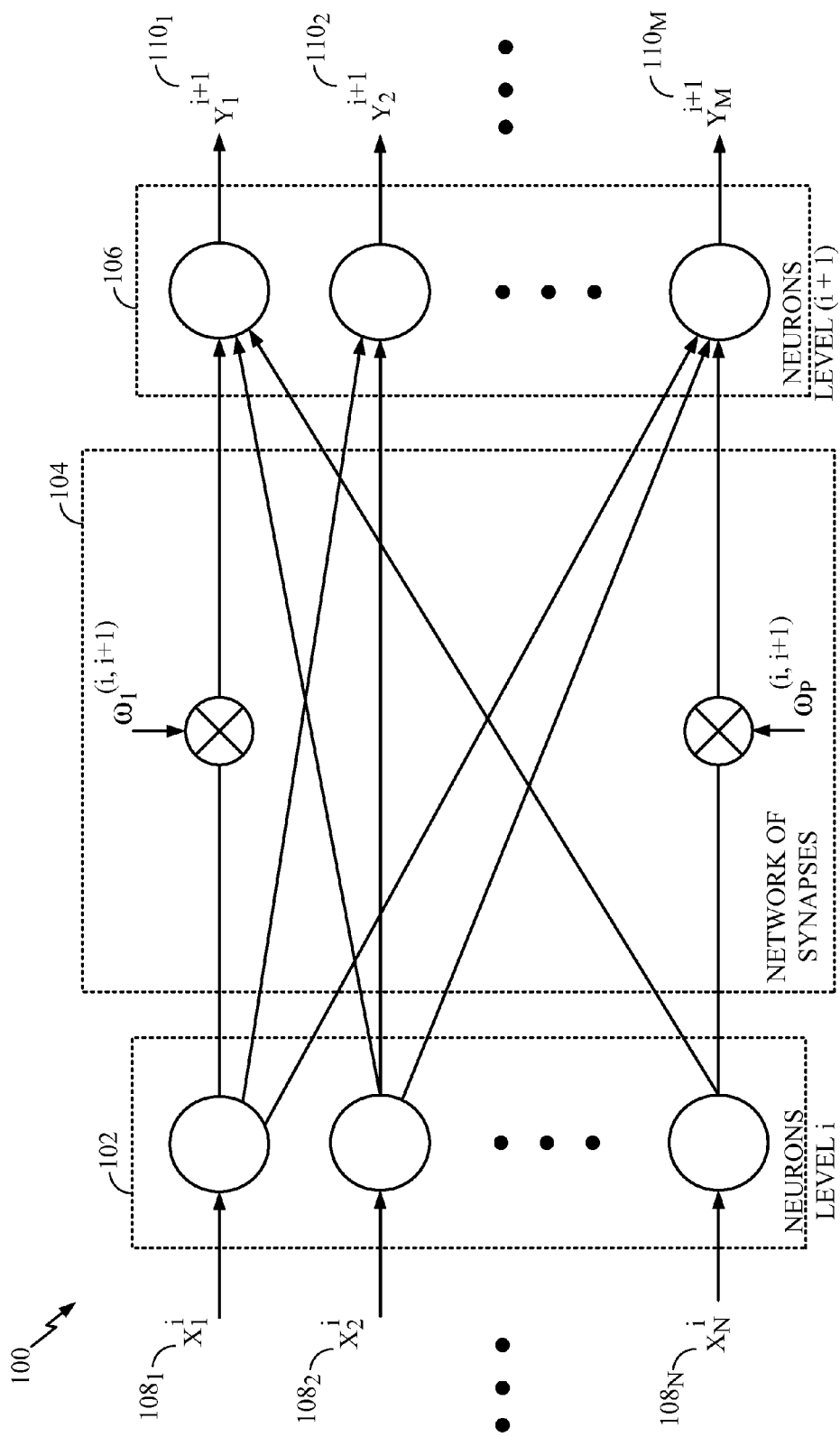
FIG. 1 illustrates an example neural system in accordance with certain embodiments of the present disclosure.

FIG. 1 illustrates an example neural system 100 with multiple levels of neurons in accordance with certain embodiments of the present disclosure. The neural system 100 may comprise a level of neurons 102 connected to another level of neurons 106 though a network of synaptic connections 104.

For simplicity, only two levels of neurons are illustrated in FIG. 1, although more levels of neurons may exist in a typical neural system.

As illustrated in FIG. 1, each neuron in the level 102 may receive an input signal 108 that may be generated by a plurality of neurons of a previous level (not shown in FIG. 1). The signal 108 may represent an input current of the level 102 neuron. This current may be accumulated on the neuron membrane to charge a membrane potential. When the membrane potential reaches its threshold value, the neuron may fire and generate an output spike to be transferred to the next level of neurons (e.g., the level 106).

The transfer of spikes from one level of neurons to another may be achieved through the network of synaptic connections (or simply "synapses") 104, as illustrated in FIG. 1. The synapses 104 may receive output signals (i.e., spikes) from the level 102 neurons, scale those signals according to adjustable synaptic weights $w_1^{(i,i+1)}, \ldots, w_P^{(i,i+1)}$ (where P is a total number of synaptic connections between the neurons of levels 102 and 106), and combine the scaled signals as an input signal of each neuron in the level 106. Every neuron in the level 106 may generate output spikes 110 based on the corresponding combined input signal. The output spikes 110 may be then transferred to another level of neurons using another network of synaptic connections (not shown in FIG. 1).

The neural system 100 may be emulated by an electrical circuit and utilized in a large range of applications, such as image and pattern recognition, machine learning, and motor control. Each neuron in the neural system 100 may be implemented as a neuron circuit. The neuron membrane charged to the threshold value initiating the output spike may be implemented as a capacitor that integrates an electrical current flowing through it.

Exemplary Reward-Modulated Spike-Timing-Dependent-Plasticity

Figure 2:
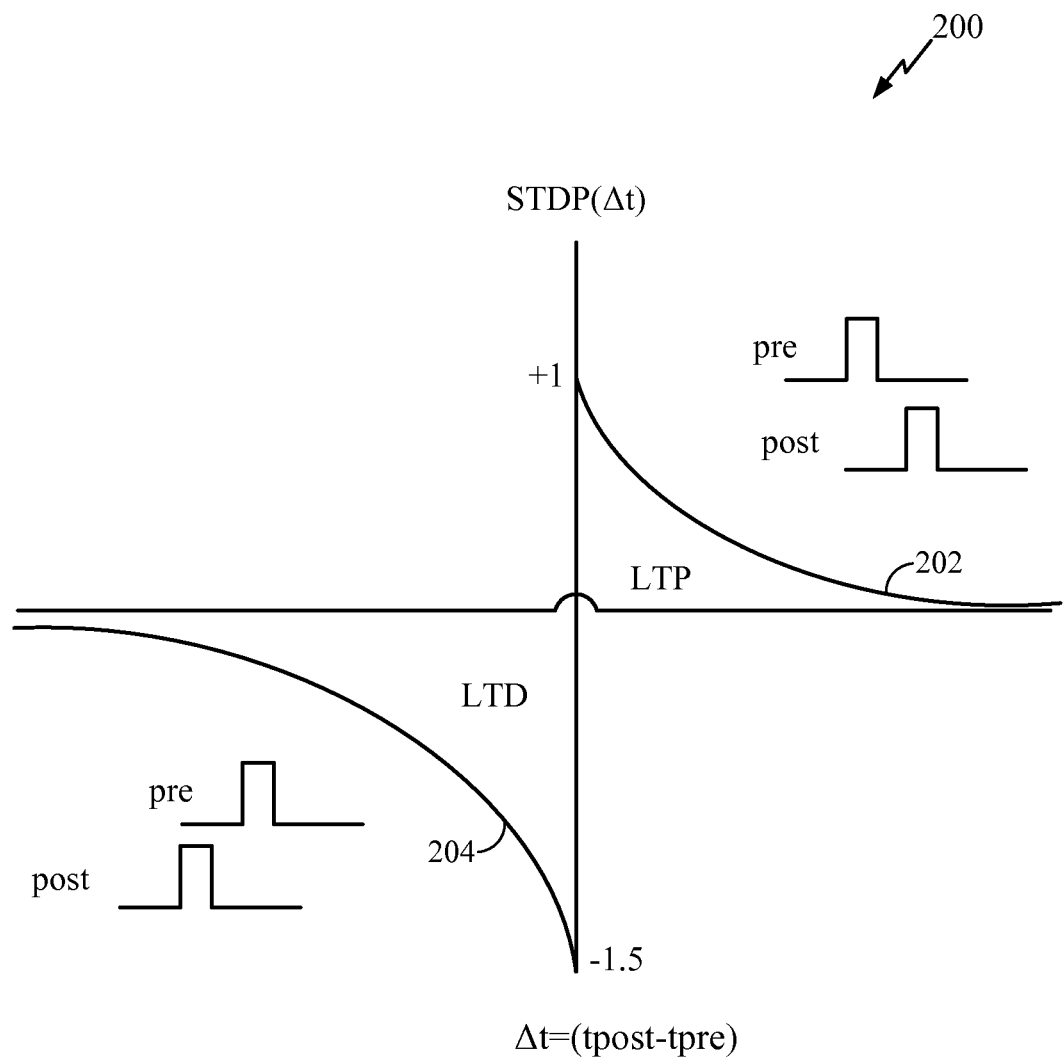
FIG. 2 illustrates an example graph diagram of a synaptic weight change as a function of relative timing of pre-synaptic and post-synaptic spikes in accordance with certain embodiments of the present disclosure.

The adjustment of synapse weights of the synapse network 104 during the training process may be based on the Spike-Timing-Dependent Plasticity (STDP). FIG. 2 illustrates an example graph diagram 200 of a synaptic weight change as a function of relative timing of pre-synaptic and post-synaptic spikes in accordance with the STDP. If a pre-synaptic neuron fires before a post-synaptic neuron, then a corresponding synaptic weight may be increased, as illustrated in a portion 202 of the graph 200. This weight increase can be referred as a Long-Term Potentiation (LTP) of the synapse. It can be observed from the graph portion 202 that the amount of LTP may decrease roughly exponentially as a function of difference between pre-synaptic and post-synaptic spike times. The reverse order of firing may reduce the synaptic weight, as illustrated in a portion 204 of the graph 200, causing a Long-Term Depression (LTD) of the synapse.

As illustrated in FIG. 2, the synaptic weight-training curve may be asymmetrical. The LTP weight increment represented by the graph portion 202 may be larger for short inter-spike intervals, but it may decay faster than the LTD weight increment. The dominance of LTD outside the causality window may cause weakening of synapses when pre-synaptic spikes occur randomly in time with respect to post-synaptic action potentials. Therefore, these random events may not consistently contribute evoking the synapses.

Figure 3:
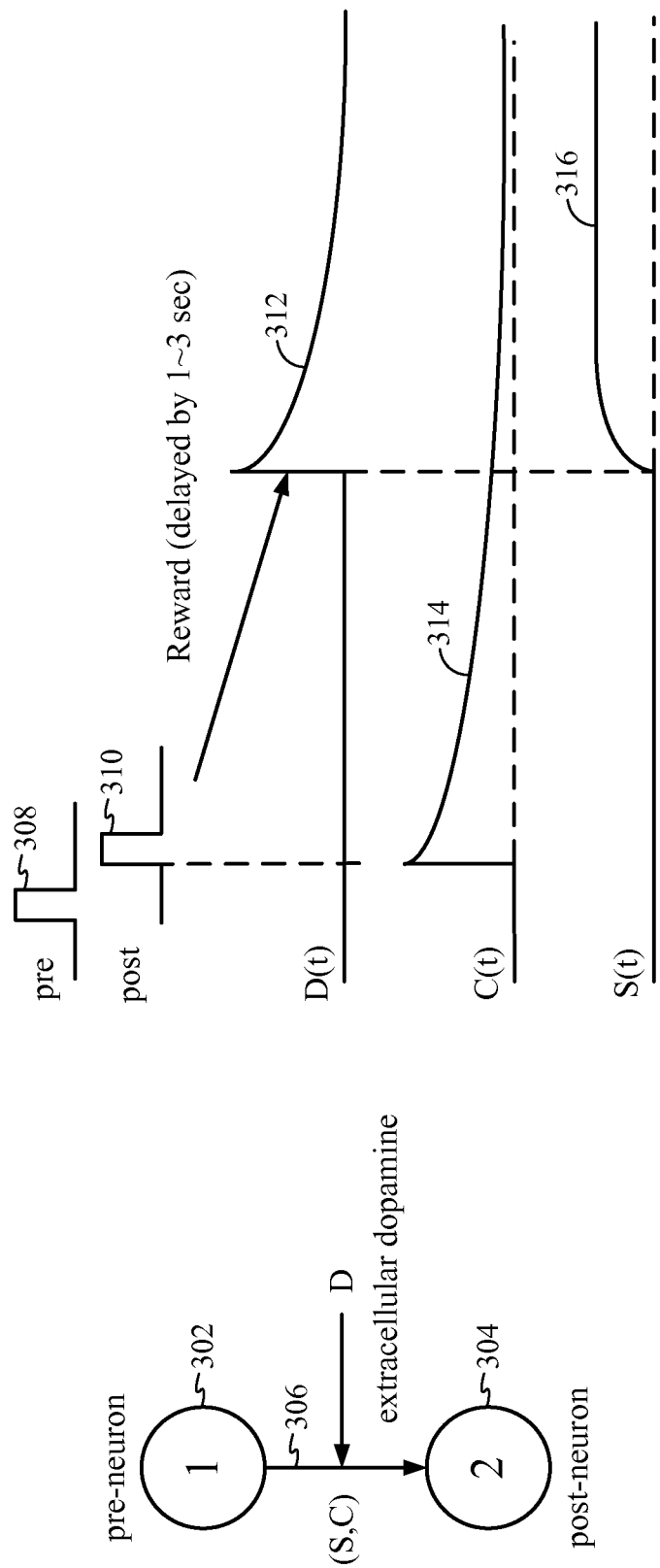
FIG. 3 illustrates an example of synapse weight change with eligibility trace and distal reward in accordance with certain embodiments of the present disclosure.

FIG. 3 illustrates an example of synapse weight change based on the STDP with distal reward in accordance with certain embodiments of the present disclosure. A pre-synaptic neuron 302 may be connected with a post-synaptic neuron 304 via a synapse 306. The state of synapse 306 may be described by two variables: synaptic strength (i.e., weight) S and activation C of an enzyme important for plasticity.

The pre-synaptic neuron 302 may fire a spike 308, which may be followed by another spike 310 fired by the post-synaptic neuron 304. After this sequence of spiking events, a reward to the synaptic connection 306 may be delivered in the form of a spike of extracellular dopamine (DA) with a random delay between 1 and 3 seconds from the sequence of pre- and post-synaptic spikes. A change of the extracellular concentration of DA over time may be represented as:

$$\dot{D} = -D/\tau_D + DA(t), \quad (1)$$

where D is the extracellular concentration of DA, $\tau_D$ is the decay time constant, and DA(t) models a source of DA due to activities of dopaminergic neurons. An exponentially decaying curve 312 from FIG. 3 illustrates the change of extracellular concentration of DA over time given by equation (1).

A change of the variable C over time may be given by:

$$\dot{C} = -/\tau_C + STDP(\Delta t) \cdot \delta(t - t_{pre/post}), \quad (2)$$

where $\tau_c$ is the decay time constant, and $\delta(t)$ is the Dirac delta function. Firings of pre- and post-synaptic neurons 302-304 occurring at times $t_{pre/post}$, respectively, may change the variable C by the amount STDP($\Delta t$) depicted in FIG. 2, where $\Delta t = t_{post} - t_{pre}$ is the inter-spike interval. The variable C may exponentially decay to zero with the time constant $\tau_C$, as illustrated with a plot 314 in FIG. 3.

The decay rate of the curve 314 may control the sensitivity of plasticity to the delayed reward. The curve 314 may act as the eligibility trace for synaptic modification, as the variable C may allow change of the synaptic strength S when being gated by the extracellular concentration of DA (the variable D). Therefore, the change of synaptic strength may be given as:

$$\dot{S} = C \cdot D. \quad (3)$$

A plot 316 in FIG. 3 illustrates the change of synaptic strength defined by equation (3).

The aforementioned reward-modulated STDP represents a learning rule for behaviorally relevant synapse weight changes in networks of spiking neurons. As illustrated by FIG. 3, this scheme may require an exponentially decaying eligibility trace with a time constant of a plurality of seconds for every synapse. Since neural systems of interest often have millions of synapses, implementing such an exponentially decaying eligibility trace for every synapse may be very expensive in terms of silicon area.

The present disclosure proposes a simpler version of the eligibility trace, and two hardware implementations based on this modified eligibility trace are presented. The effect of modified eligibility trace on the synaptic weight of neurons is then simulated, and it is shown that this scheme provides similar results as the conventional (i.e., exponential) eligibility trace. The proposed hardware implementations utilize Spin Torque Transfer Random Access Memory (STT-RAM) and conventional digital memory, respectively, and demonstrate area-efficient approaches for implementing the reward-modulated STDP in hardware.

Exemplary Simulations

Simulations are first presented in this disclosure to show that an eligibility trace based mechanism may increase the probability of a post-synaptic neuron responding to a pre-synaptic neuron when that pre-post spike pair triggers a reward.

Figure 4:
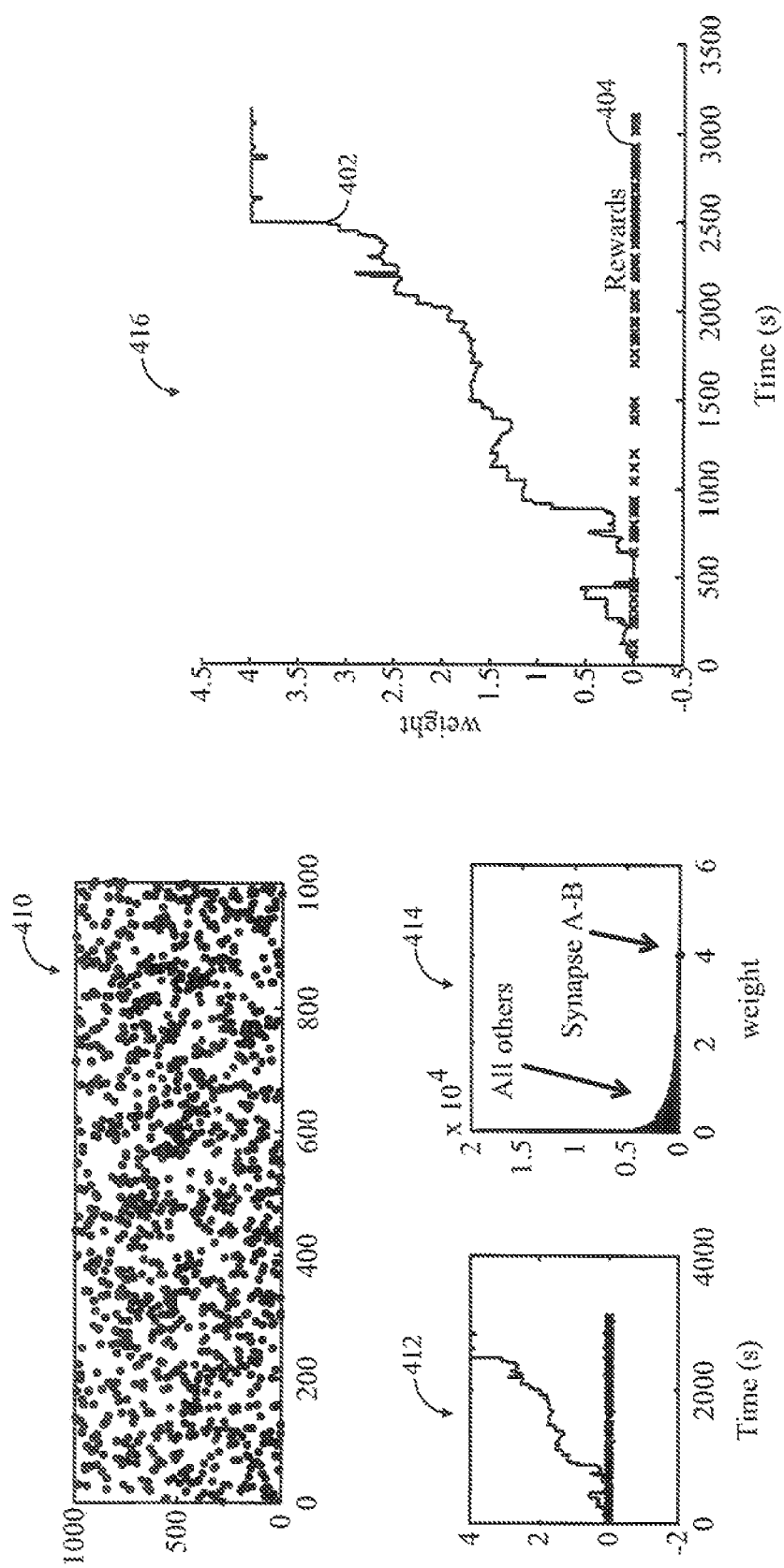
FIG. 4 illustrates an example weight increase of a synapse over a plurality of trainings in accordance with certain embodiments of the present disclosure.

FIG. 4 illustrates an example weight increase of a synapse over three thousands of trainings (a plot 402) along with increasing probability of eliciting a reward as plot 404) in accordance with certain embodiments of the present disclosure. FIG. 4 includes graphs 410, 412, 414 and 416. This simulation may be used as a metric to check if modified eligibility traces discussed in details later provide similar results as the conventional (i.e., exponential) eligibility trace. A reward may be delivered after a random interval each time a pre-synaptic neuron A fires before a post-synaptic neuron B. This may potentiate only a synapse connecting the neurons A and B while depressing all other synapses.

Figure 5:
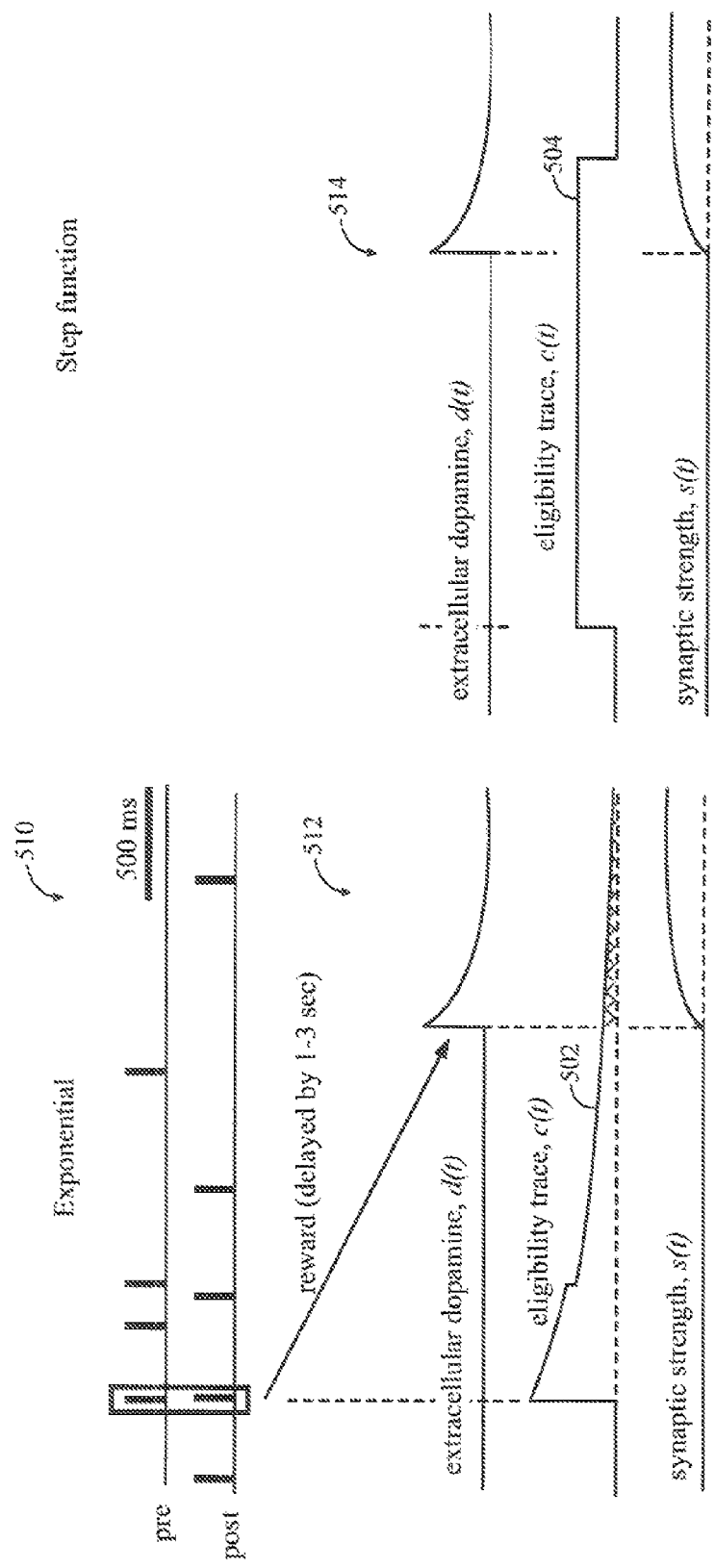
FIG. 5 illustrates an example exponential and step-function versions of an eligibility trace for reward-modulated spike-timing-dependent plasticity (STDP) learning rule in accordance with certain embodiments of the present disclosure.

FIG. 5 illustrates an example exponential and step-function versions of an eligibility trace in accordance with certain embodiments of the present disclosure. FIG. 5 includes graphs 510, 512 and 514. Implementing an exponentially decaying eligibility trace in hardware, such as a trace 502 in FIG. 5, may be very area expensive since it may require a dedicated circuit per synapse. Some estimates suggest that an analog implementation of such synapse may require approximately 3,371 μm², whereas a digital implementation may require approximately 149 μm². Implementing dense neural architectures in hardware may require that an area budget per synapse may be less than 1 μm².

To achieve this requirement, a modified version of the eligibility trace is proposed in the present disclosure that is flat for a given time constant after which it drops to zero, as illustrated by a trace 504 in FIG. 5. Such a discrete step-function may represent a possible solution since there is no experimental evidence that the eligibility trace should be exponential. Instead, the experimental evidence only suggests that the time-constant of the response to dopamine is typically shorter than 15 seconds.

Exemplary STT-RAM Based Implementation of Eligibility Trace

Figure 6:
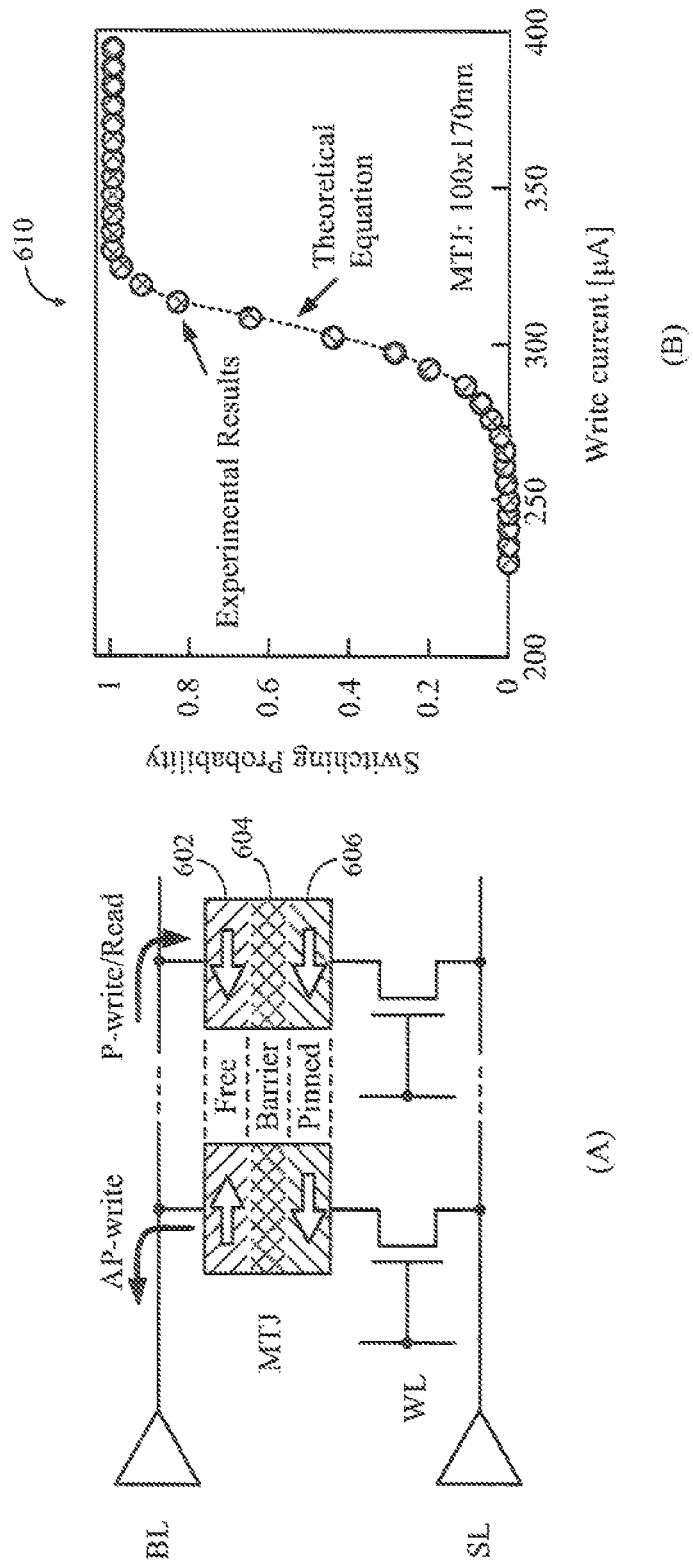
FIG. 6 illustrates an example structure of Spin Torque Transfer Random Access Memory (STT-RAM) in accordance with certain embodiments of the present disclosure.

Spin Torque Transfer Random Access Memory (STT-RAM) is a memory technology where an electrical current can be polarized by aligning the spin of electrons flowing through a magnetic tunnel junction (MTJ) element. The MTJ element may comprise two magnetic layers 602, 606 and a tunnel barrier layer 604 between them, as illustrated in FIG. 6A. One of the magnetic layers may represent a switching layer 602, and the other magnetic layer 606 may be pinned in its magnetization direction. Data writing may be performed by using the spin-polarized current to change the magnetic orientation of the switching layer 602 in the MTJ element. The resultant resistance difference of the MTJ element may be used for information readout.

STT-RAMs possess the unique property that their switching may be probabilistic when presented with a threshold current pulse. Switching probability as a function of applied current is illustrated in graph 610 of FIG. 6B. This behavior is exploited in the present disclosure for implementing the modified eligibility trace 504 from FIG. 5 for the reward-modulated STOP.

A first implementation of the eligibility trace may utilize a memory array S to store all synaptic weights, a clone of the memory array S' and an STT-RAM element R per synapse. Each time a pre-post spiking event occurs which may lead to a change in the weight of $S_i$, $S_i'$ may be updated with the new weight ($S_i' = S_i' + \Delta w$) while $S_i$ may be kept constant. In addition, $R_i$ may be set to logical '1'. At a frequency of, for example, 1 Hz, a threshold pulse may be applied to the entire neural network and all the STT-RAMs which were in the logical '1' state may be switched to logical '0' state with a probability (P=½). Then, N seconds after the weight change happens on $S_i'$, $P(R_i=1)=(½)^N$.

Thus, the STT-RAMs may provide each synapse with a one-bit signal that may probabilistically decay to zero after every pre-post spike pair. Generating this distribution may be extremely area efficient, i.e., one Negative-channel Metal Oxide Semiconductor (NMOS) transistor may be required per STT-RAM element for storing one bit of information. Further, this solution may be also power efficient, i.e., only one threshold pulse may be required every second.

When a reward occurs, each STT-RAM element may be checked and the following rule may be applied:

If $R_i=1$, then $S_i=S_i'$ (i.e., if STT-RAM is high, adopt the change) and $R_i=0$, else $Si'=Si$ (i.e., if STT-RAM is low, revert backup memory).

This may be an expensive operation since the entire memory array may need to be read and copied. However, this may be a very rare event, and, therefore, the system may be overclocked soon after a reward. Alternatively, such a weight change may be implemented over many clock cycles.

Figure 7:
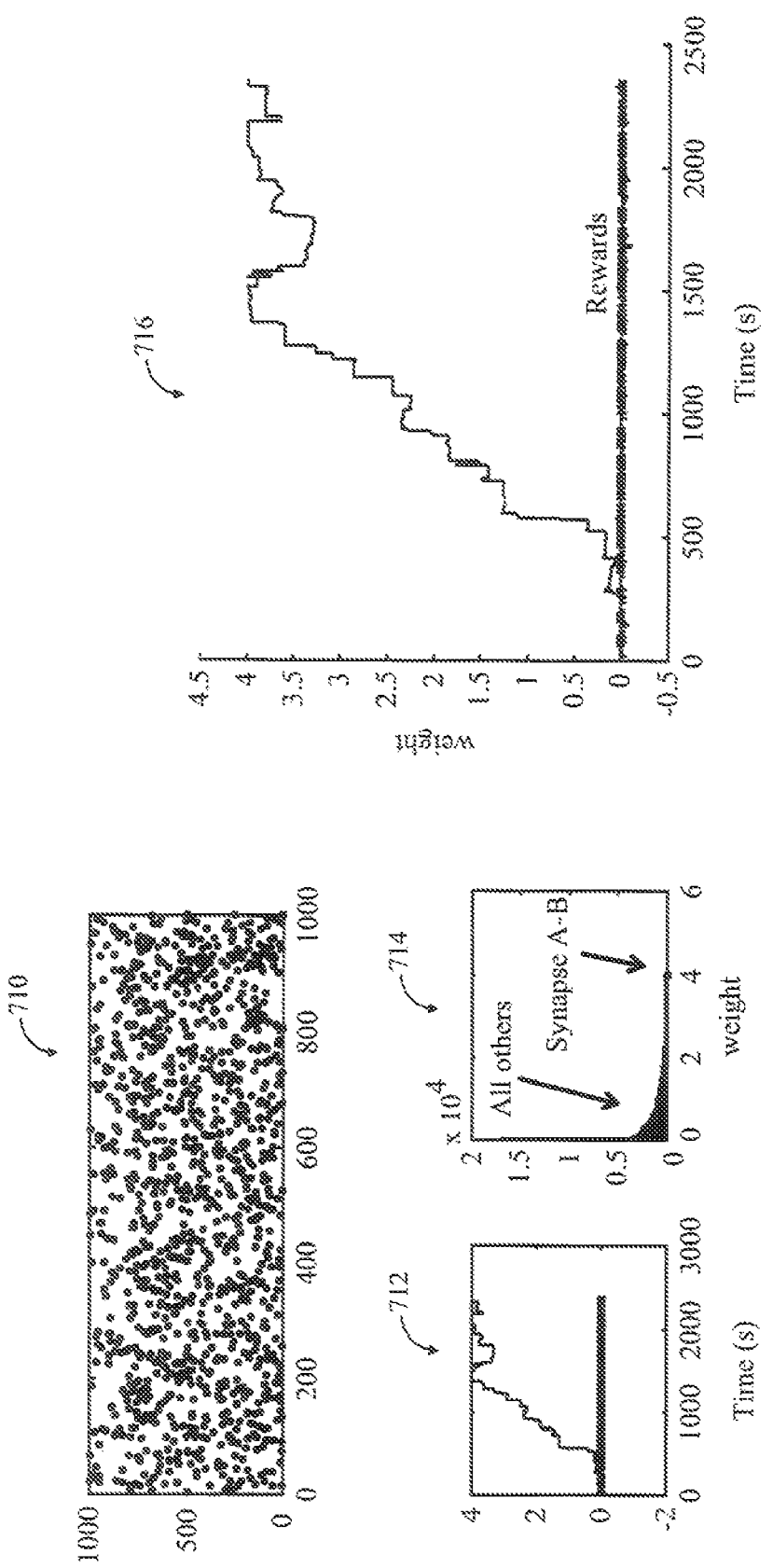
FIG. 7 illustrates an example STT-RAM based eligibility rule for potentiating synapses in accordance with certain embodiments of the present disclosure.

To verify that such modified eligibility trace may provide similar results compared to the original exponential eligibility trace, the simulations from FIG. 4 are repeated for the modified eligibility trace and obtained results are illustrated in graphs 710, 712, 714 and 716 of FIG. 7. It can be again observed that the weight of synapse connecting the pair of pre- and post-synaptic neurons A and B may increase over time and the final distribution of synaptic weights may be very similar to that illustrated in FIG. 4.

One potential issue with the aforementioned hardware implementation scheme is an inherent variability of the STT-RAM concerning the threshold current pulse that may be required to switch the device. Some simulation data suggests that this variance may be expected to decrease with increase in area of the device and may be a function of critical current, pulse width, magnetic tunneling junction (MTJ) resistance, and tunnel magneto-resistance (TMR).

Nevertheless, it may be expected that a fraction of the devices may switch with a probability $(½)^N$, and the rest of devices may switch with a distribution of probabilities and hence a distribution of time constants. Therefore, it may be instructive to examine the response of devices at the two extremes, namely those with probabilities of P=1 and P=0.

Elements which may switch with the probability of P=1 may be associated with a very short eligibility trace and may respond in a manner similar to the other neurons illustrated in FIG. 7, which may be insensitive to dopamine Elements with the switching probability of P=0 may have a constantly 'high' eligibility trace and these neurons again may not respond to dopamine. This may be intuitively understood since a constantly high eligibility trace may not convey any information regarding the timing of STDP relative to dopamine and hence may be equivalent to a zero eligibility trace.

Exemplary Digital Memory Based Implementation of Eligibility Trace

An alternative hardware implementation of an eligibility trace for the reward-modulated STDP may utilize a conventional digital memory like Dynamic Random Access Memory (DRAM). This may be achieved by again maintaining a copy of the synaptic weight S' and a single bit $R_i$ per synapse. This single bit per synapse may be stored in a separate memory bank with an identical memory mapping as the synaptic weights.

Similar to the STT-RAM implementation, each time a pre-post spiking event occurs which may lead to a change in the weight of $S_i$, $S_i'$ may be updated with the new weight ($S_i'=S_i'+\Delta w$) while $S_i$ may be kept constant. In addition, $R_i$ may be set to logical '1'. All logical 1s, i.e., entire pages of the R memory bank, may be read out with frequency of, for example, 1 Hz and logically 'AND'ed with a random bit sequence. This may ensure that all the elements which were in the logical '1' state may be switched to the logical '0' state with a probability (P=½). Then, N seconds after the weight change happens on $S_i'$, $P(R_i==1)=(½)^N$. When a reward occurs, the R memory may be checked and the following rule may be applied to modify the synaptic weights:

If $R_i=1$, then $S_i=S_i'$ and $R_i=0$, else $S_i'=S_i$.

This hardware implementation scheme of the eligibility trace may avoid the probabilistic switching of the STT-RAM based implementation. On the other hand, this solution may suffer from the read and write overhead of the R memory.

Figure 8:
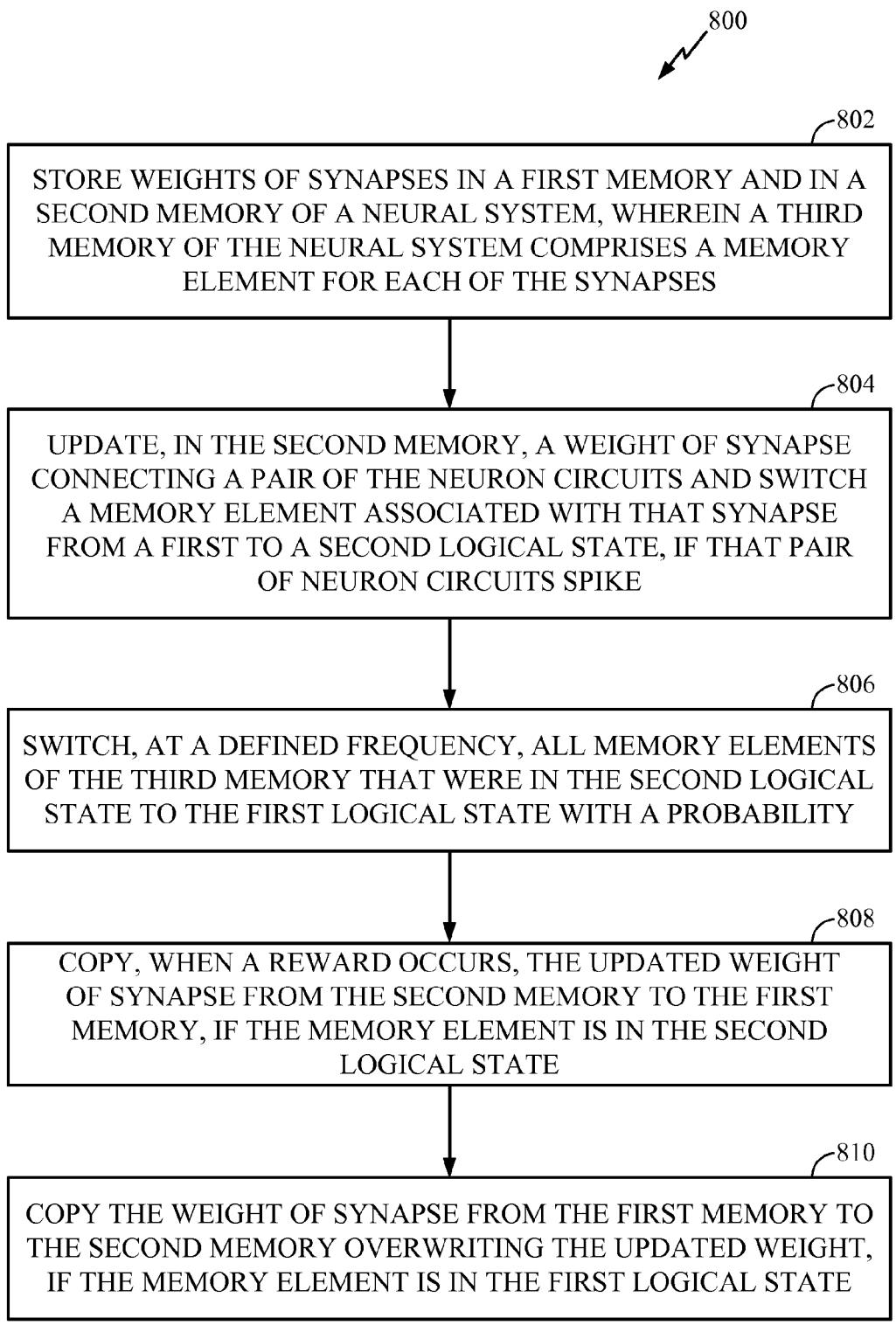
FIG. 8 illustrates example operations for implementing a neural system with the reward-modulated STDP in accordance with certain embodiments of the present disclosure.

FIG. 8 illustrates example operations 800 for implementing a neural system with the reward-modulated STDP based on the modified eligibility trace form FIG. 5 in accordance with certain embodiments of the present disclosure. The neural system may comprise a plurality of neuron circuits and synapses, wherein each of the synapses may connect a pair of the neuron circuits. At 802, weights of the synapses may be stored in a first memory and in a second memory of the neural system, wherein a third memory of the neural system comprises one memory element for each of the synapses. At 804, if a pair of neuron circuits spike, a weight of synapse connecting that pair of neuron circuits may be updated in the second memory, and a memory element of the third memory associated with that synapse may be switched from a first to a second logical state.

At 806, all memory elements of the third memory that were in the second logical states may switch at a defined frequency to the first logical state with a probability. At 808, when a reward occurs, the updated weight of synapse may be copied from the second memory to the first memory, if the memory element is in the second logical state. On the other hand, if the memory element is in the first logical state, the weight of synapse may be copied, at 810, from the first memory to the second memory overwriting the updated weight in the second memory.

In summary, two hardware implementations of the modified eligibility trace are proposed in the present disclosure. These schemes may allow implementation of the reward-modulated STDP with a minimal area penalty.

Figure 8A:
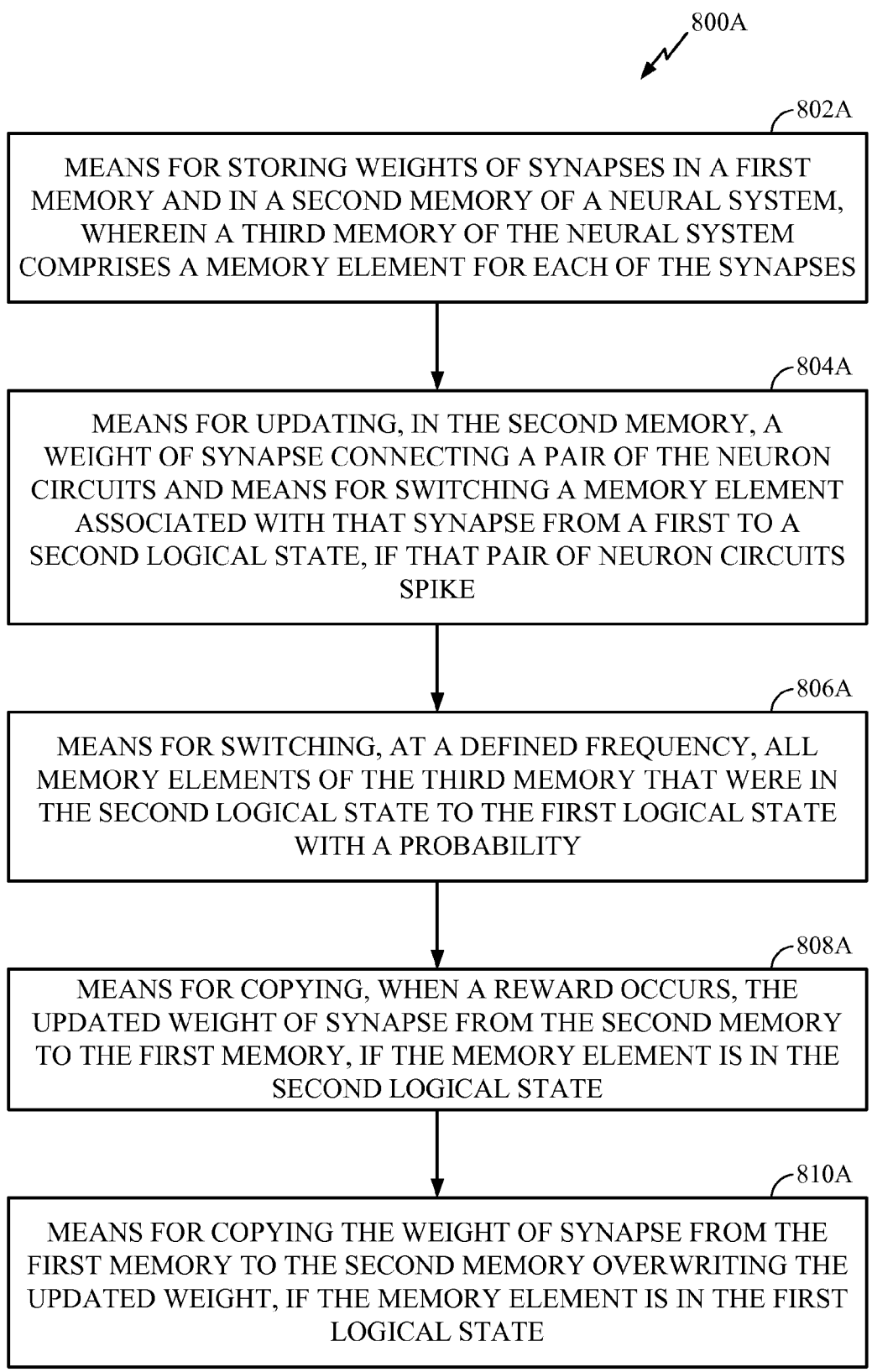
FIG. 8A illustrates example components capable of performing the operations illustrated in FIG. 8.

The various operations of methods described above may be performed by any suitable means capable of performing the corresponding functions. The means may include various hardware and/or software component(s) and/or module(s), including, but not limited to a circuit, an application specific integrate circuit (ASIC), or processor. Generally, where there are operations illustrated in Figures, those operations may have corresponding counterpart means-plus-function components with similar numbering. For example, operations 800 illustrated in FIG. 8 correspond to components 800A illustrated in FIG. 8A.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general-purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers.

Thus, certain embodiments may comprise a computer program product for performing the operations presented herein. For example, such a computer program storage apparatus may comprise a computer readable memory having instructions stored (and/or encoded) thereon, the instructions being executable by one or more processors to perform the operations described herein. For certain embodiments, the computer program storage apparatus may include packaging material for the computer readable memory.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to embodiments of the present disclosure, other and further embodiments of the disclosure may be devised without departing from the basic scope thereof, and the scope thereof is determined by the claims that follow.

What is claimed is:

1. A neural electrical circuit, comprising:
a plurality of neuron circuits and synapses, wherein each of the synapses connects one pair of the neuron circuits; and
a first memory storing weights of the synapses, a second memory storing the same weights and a third memory comprising one element for each of the synapses, wherein
a weight of synapse connecting a pair of the neuron circuits is updated in the second memory and an element of the third memory associated with that synapse is switched from a first to a second logical state, if that pair of neuron circuits spike,
all elements of the third memory which were in the second logical state switch at a defined frequency to the first logical state with a probability,
when a reward occurs, the updated weight of synapse is copied from the second memory to the first memory, if the element is in the second logical state, and
the weight of synapse is copied from the first memory to the second memory overwriting the updated weight, if the element is in the first logical state.

2. The electrical circuit of claim 1, wherein a threshold pulse is applied at the defined frequency causing the elements of the third memory to switch from the second logical state to the first logical state with the probability.

3. The electrical circuit of claim 1, wherein all the elements of the third memory that were in the second logical state are read at the defined frequency and logically 'AND'ed with a random bit sequence.

4. The electrical circuit of claim 1, wherein the third memory comprises a Spin Torque Transfer Random Access Memory (STT-RAM).

5. The electrical circuit of claim 1, wherein the third memory comprises a Dynamic Random Access Memory (DRAM).

6. The electrical circuit of claim 1, wherein the defined frequency is equal to 1 Hz and the probability is equal to one-half.

7. The electrical circuit of claim 1, wherein each of the elements of the third memory comprises one Negative-channel Metal Oxide Semiconductor (NMOS) transistor for storing one bit of information.

8. The electrical circuit of claim 1, wherein the first logical state comprises a logical '0' state and the second logical state comprises a logical '1' state.

9. A method for implementing a neural system with a plurality of neuron circuits and synapses, wherein each of the synapses connects one pair of the neuron circuits, comprising:
  storing weights of the synapses in a first memory and in a second memory of the neural system, wherein a third memory of the neural system comprises one element for each of the synapses;
  updating, in the second memory, a weight of synapse connecting a pair of the neuron circuits and switching an element of the third memory associated with that synapse from a first to a second logical state, if that pair of neuron circuits spike;
  switching, at a defined frequency, all elements of the third memory which were in the second logical state to the first logical state with a probability;
  copying, when a reward occurs, the updated weight of synapse from the second memory to the first memory, if the element is in the second logical state; and
  copying the weight of synapse from the first memory to the second memory overwriting the updated weight, if the element is in the first logical state.

10. The method of claim 9, further comprising:
  applying, at the defined frequency, a threshold pulse to the neural system causing the elements to switch from the second logical state to the first logical state with the probability.

11. The method of claim 9, further comprising
  reading, at the defined frequency, all the elements of the third memory which were in the second logical state; and
  performing logical operation between the read elements and a random bit sequence.

12. The method of claim 9, wherein the third memory comprises a Spin Torque Transfer Random Access Memory (SIT-RAM).

13. The method of claim 9, wherein the third memory comprises a Dynamic Random Access Memory (DRAM).

14. The method of claim 9, wherein the defined frequency is equal to 1 Hz and probability is equal to one-half.

15. The method of claim 9, wherein each of the elements of the third memory comprises one Negative-channel Metal Oxide Semiconductor (NMOS) transistor for storing one bit of information.

16. The method of claim 9, wherein the first logical state comprises a logical '0' state and the second logical state comprises a logical '1' state.

17. An apparatus for implementing a neural system with a plurality of neuron circuits and synapses, wherein each of the synapses connects one pair of the neuron circuits, comprising:
  means for storing weights of the synapses in a first memory and in a second memory of the neural system, wherein a third memory of the neural system comprises one element for each of the synapses;
  means for updating, in the second memory, a weight of synapse connecting a pair of the neuron circuits and switching an element of the third memory associated with that synapse from a first to a second logical state, if that pair of neuron circuits spike;
  means for switching, at a defined frequency, all elements of the third memory which were in the second logical state to the first logical state with a probability;
  means for copying, when a reward occurs, the updated weight of synapse from the second memory to the first memory, if the element is in the second logical state; and
  means for copying the weight of synapse from the first memory to the second memory overwriting the updated weight, if the element is in the first logical state.

18. The apparatus of claim 17, further comprising:
  means for applying, at the defined frequency, a threshold pulse to the neural system causing the elements to switch from the second logical state to the first logical state with the probability.

19. The apparatus of claim 17, further comprising:
  means for reading, at the defined frequency, all the elements of the third memory which were in the second logical state; and
  means for performing logical operation between the read elements and a random bit sequence.

20. The apparatus of claim 17, wherein the third memory comprises a Spin Torque Transfer Random Access Memory (STT-RAM).

21. The apparatus of claim 17, wherein the third memory comprises a Dynamic Random Access Memory (DRAM).

22. The apparatus of claim 17, wherein the defined frequency is equal to 1 Hz and the probability is equal to one-half.

23. The apparatus of claim 7, wherein each of the elements of the third memory comprises one Negative-channel Metal Oxide Semiconductor (NMOS) transistor for storing one hit of information.

24. The apparatus of claim 17, wherein the first logical state comprises a logical '0' state and the second logical state comprises a logical '1' state.

25. A non-transitory computer program storage apparatus for implementing a neural system with a plurality of neuron circuits and synapses, wherein each of the synapses connects one pair of the neuron circuits, comprising a computer-readable memory having software instructions stored thereon, the software instructions being executable h one or more processors and the software instructions comprising:
  instructions for storing weights of the synapses in a first memory and in a second memory of the neural system, wherein a third memory of the neural system comprises one element for each of the synapses;
  instructions for updating, in the second memory, a weight of synapse connecting a pair of the neuron circuits and switching an element of the third memory associated, with that synapse from a first to a second logical state, if that pair of neuron circuits spike;
  instructions for switching, at a defined frequency, all elements of the third memory which were in the second logical state to the first logical state with a probability;
  instructions for copying, when a reward occurs, the updated weight of synapse from the second memory to the first memory, if the element is in the second logical state; and instructions for copying the weight of synapse from the first memory to the second memory overwriting the updated weight, if the element is in the first logical state.

26. The non-transitory computer program storage apparatus of claim 25, further comprising:
   instructions for applying, at the defined frequency, a threshold pulse to the neural system causing the elements to switch from the second logical state to the first logical state with the probability.

27. The non-transitory computer program storage apparatus of claim 25, further comprising:
   instructions for reading, at the defined frequency, all the elements of the third memory which were in the second logical state; and
   instructions for performing logical operation between the read elements and a random bit sequence.

* * * * *